United States Patent [19]
Morris et al.

[11] Patent Number: 5,436,181
[45] Date of Patent: Jul. 25, 1995

[54] METHOD OF SELF ALIGNING AN EMITTER CONTACT IN A HETEROJUNCTION BIPOLAR TRANSISTOR

[75] Inventors: Francis J. Morris, Plano; Jau-Yuann Yang, Richardson; Donald L. Plumton; Han-Tzong Yuan, both of Dallas, all of Tex.

[73] Assignee: Texas Instruments Incorporated, Dallas, Tex.

[21] Appl. No.: 229,044

[22] Filed: Apr. 18, 1994

[51] Int. Cl.$^6$ ........................... H01L 21/331
[52] U.S. Cl. ..................... 437/31; 437/133; 148/DIG. 11; 148/DIG. 72
[58] Field of Search ............... 437/31, 133; 148/DIG. 72, DIG. 10, DIG. 11

[56] References Cited

U.S. PATENT DOCUMENTS

| | | | |
|---|---|---|---|
| 4,751,195 | 6/1988 | Kawai | 437/31 |
| 4,948,751 | 8/1990 | Okamoto et al. | 437/133 |
| 4,954,457 | 9/1990 | Jambotkar | 437/133 |
| 5,064,772 | 11/1991 | Jambotkar | 148/DIG. 72 |
| 5,068,756 | 11/1991 | Morris et al. | 357/16 |
| 5,077,231 | 12/1991 | Plumton et al. | 437/51 |
| 5,166,081 | 11/1992 | Inada et al. | 437/133 |

OTHER PUBLICATIONS

Kimiyoshi Yamasaki, Kazuyoshi Asai, and Katsuhiko Kuramada, "GaAs LSI-Directed MESFET's with Self-Aligned Implantation for n+-Layer Technology (SAINT)", *IEEE Transactions on Electron Devices*, vol. ED-29, No. 11, Nov. 1982, pp. 1772–1777.

Shin-Ichi Shikata, Jun-Ichi Tsuchimoto, and Hideki Hayashi, "A Novel Self-Aligned Gate Process for Half-Micrometer Gate GaAs IC's Using ECR-CVD", *IEEE Transactions on Electron Devices*, vol. 37, No. 8, Aug. 1990, pp. 1800–1803.

Primary Examiner—Brian F. Hearn
Assistant Examiner—Tuan Nguyen
Attorney, Agent, or Firm—Michael K. Skrehot; James C. Kesterson; Richard L. Donaldson

[57] ABSTRACT

A method of self aligning an emitter contact includes forming a base layer (18) on a portion of a collector layer (16). An interface layer (22) is formed on the base layer (18) such that a portion of the base layer (18) remains exposed. An emitter layer (24) is formed on the collector layer (16), the interface layer (22), and the exposed portion of the base layer (18). An emitter cap layer (26) is formed on the emitter layer (24) over the previously exposed area of the base layer (18). An insulating layer (28) is formed on the interface layer (22). An emitter contact (36) is formed on the emitter cap layer (26) at the previously exposed area of the base layer (18). The insulating layer (28) isolates the emitter contact (36) from the base layer (18) and a subsequently formed base contact (38). The insulating layer (28) ensures isolation between the emitter contact (36) and the base contact (38) despite misalignment of the emitter contact (36) during formation.

15 Claims, 3 Drawing Sheets

METHOD OF SELF ALIGNING AN EMITTER CONTACT IN A HETEROJUNCTION BIPOLAR TRANSISTOR

TECHNICAL FIELD OF THE INVENTION

The present invention relates in general to semiconductor fabrication processes and more particularly to a method of self aligning an emitter contact in a heterojunction bipolar transistor.

BACKGROUND OF THE INVENTION

For continued improvements and maximum operating frequency for gallium arsenide integrated circuits, heterojunction bipolar transistors must be scaled down to less than parasitic capacitances. Reducing the size of the heterojunction bipolar transistor results in misalignment problems of the emitter contact. These misalignment problems were tolerated in conventional heterojunction bipolar transistors, but result in shorting between the emitter and the base as the transistor size decreases. Therefore, it is desirable to raise the process yield of a scaled down planar heterojunction bipolar transistor by overcoming the shorting between emitter and base due to misalignment.

SUMMARY OF THE INVENTION

From the foregoing, it may be appreciated that a need has arisen for a heterojunction bipolar transistor with reduced transistor size that does not have a short between the emitter and the base. A need has also arisen for a method of self aligning the emitter contact to avoid shorting the emitter to the base.

In accordance with the present invention, a method of self aligning an emitter contact in a heterojunction bipolar transistor is provided which substantially eliminates or reduces disadvantages and problems associated with conventional heterojunction bipolar transistor fabrication processes.

According to an embodiment of the present invention, there is provided a method of self aligning an emitter contact in a heterojunction bipolar transistor that includes forming a base layer having a second conductivity type on a portion of a collector layer having a first conductivity type. An interface layer is formed on the base layer such that a selected portion of the base layer remains exposed. An emitter layer is formed on the exposed portion of the base layer and an emitter cap layer is formed on the emitter layer. An insulating layer is formed on the interface layer and an emitter contact is formed on the emitter cap layer and the insulating layer such that the insulating layer separates the emitter contact from the base layer.

The method of the present invention provides various technical advantages over conventional heterojunction bipolar transistor fabrication processes. For example, one technical advantage is in predefining the contact region before forming the emitter contact. Another technical advantage is in the elimination of a cap etching step that avoids possible over etching problems. Yet another technical advantage is in reducing the size of the heterojunction bipolar transistor without causing a short between the emitter and the base. Other technical advantages are readily apparent to one skilled in the art from the following figures, descriptions, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like parts, in which.

DETAILED DESCRIPTION OF THE INVENTION

FIGS. 1A–F show the process steps for self aligning an emitter contact in a heterojunction bipolar transistor 10. The process steps that follow describe fabrication of an NPN device and can be readily adapted to fabricate a PNP device. Further, gallium arsenide is described as the primary material for each layer but other materials from Group III and Group V of the periodic table may be substituted.

Figure 1A:
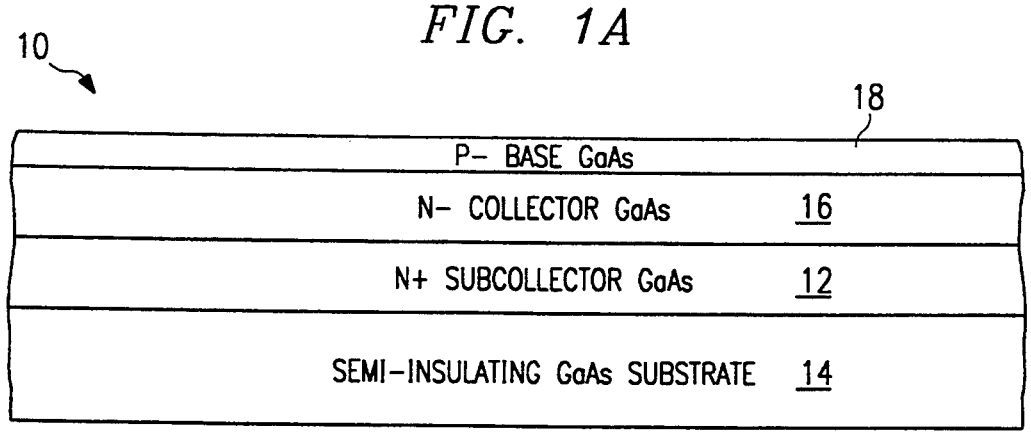
FIGS. 1A–1F illustrate a fabrication process for a heterojunction bipolar transistor.

The process begins in FIG. 1A where a subcollector layer 12 is epitaxially grown on a substrate layer 14. Substrate layer 14 is preferably made of semi-insulating gallium arsenide. Subcollector layer 12 is approximately one micron thick and doped with an N+ type conductivity having a dopant concentration of approximately $2 \times 10^{18}$ cm$^3$. A collector layer 16 is epitaxially grown on subcollector layer 12. Collector layer 16 can range in thickness from 0.3 to 2.0 microns and is doped with an N− conductivity type having a dopant concentration of approximately $1 \times 10^{16}$ cm$^3$. A base layer 18 is epitaxially grown on collector layer 16. Base layer 18 is approximately 1,000 Angstroms thick and doped with a P− conductivity type having a dopant concentration of greater than or equal to approximately $1 \times 10^{18}$ cm$^3$.

Figure 1B:
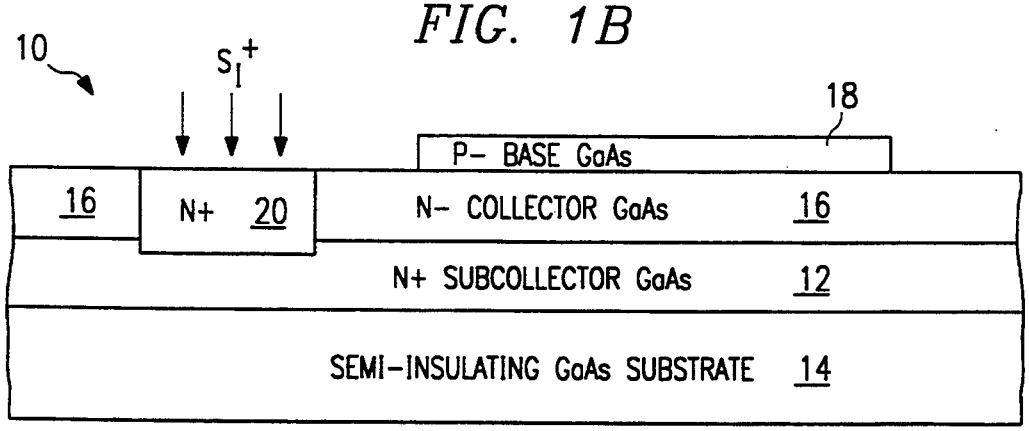

The process continues in FIG. 1B where base layer 18 is etched away such that no base layer material remains in the field region. Base layer 18 covers only a selected portion of collector layer 16. A dry or wet etching process may be used with slight over etching not impacting transistor operation. A collector implant layer 20 is patterned and implanted with an N+ conductivity type, preferably of silicon. Collector implant layer 20 may also be formed by etching down to subcollector layer 12 rather than using a silicon implant process step.

Figure 1C:
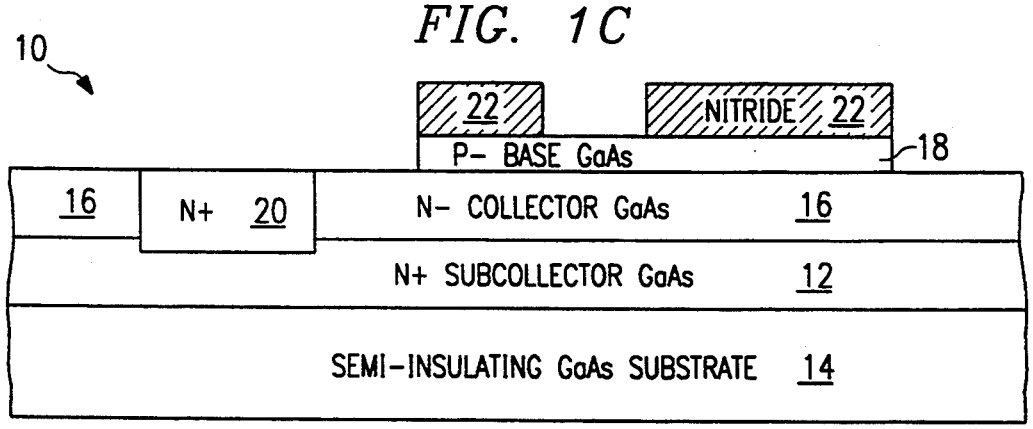

The process continues in FIG. 1C where an interface layer 22, preferably made of nitride or oxide, is deposited on transistor 10 in a thickness range from 400 to 3,000 Angstroms. Interface layer 22 is selectively removed from transistor 10 such that it remains only on base layer 18. Interface layer 22 is also removed to expose a portion of base layer 18. Photoresist used to pattern interface layer 22 is stripped away and transistor 10 is cleaned in preparation for the next epitaxial growth. During this cleaning process step, care must be exercised to prevent eroding away interface layer 22.

Figure 1D:
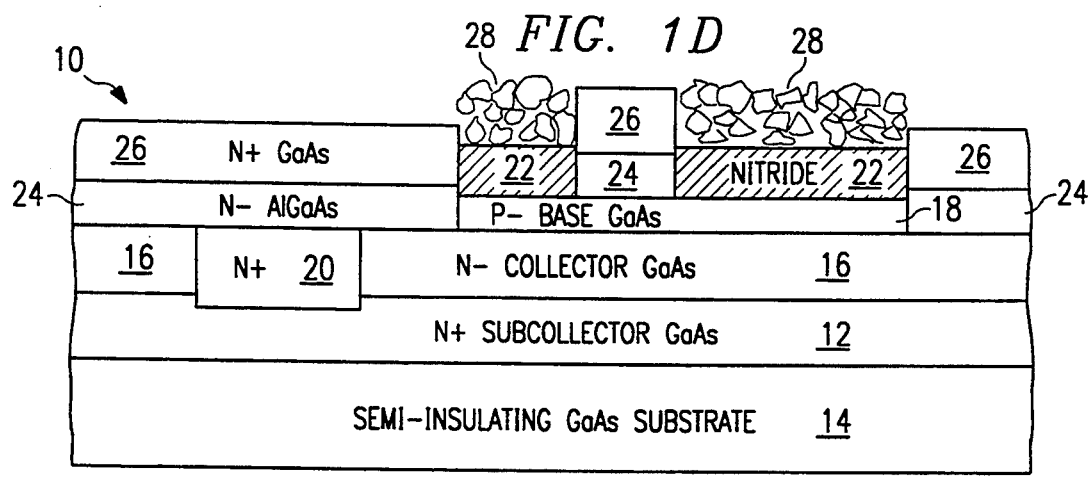

The process continues in FIG. 1D where an emitter layer 24 is epitaxially grown on transistor 10 such that emitter layer 24 covers collector layer 16, collector implant layer 20, and the exposed area of base layer 18. Emitter layer 24 is approximately 1,000 Angstroms in thickness with an N− conductivity type having a dopant concentration of approximately $2 \times 10^{17}$ cm$^3$. An emitter cap layer 26 is grown on emitter layer 24 and within the previously exposed area of base layer 18.

Emitter cap layer 26 is approximately 1,000 Angstroms thick with an N+ conductivity type having a dopant concentration of approximately $2 \times 10^{18}$ cm$^3$. An insulating layer 28, a polycrystalline material, is deposited on interface layer 22 such that interface layer 22 is buried beneath the surface of transistor 10. Insulating layer 28 occurs as a result of the epitaxial growth of emitter layer 24 and emitter cap layer 26. Depending upon growth conditions, insulating layer 28 deposits onto interface layer 22 or no deposition occurs on interface layer 22. For discussion purposes, insulating layer 28 is formed to bury interface layer 22 beneath the surface of heterojunction bipolar transistor 10.

Figure 1E:
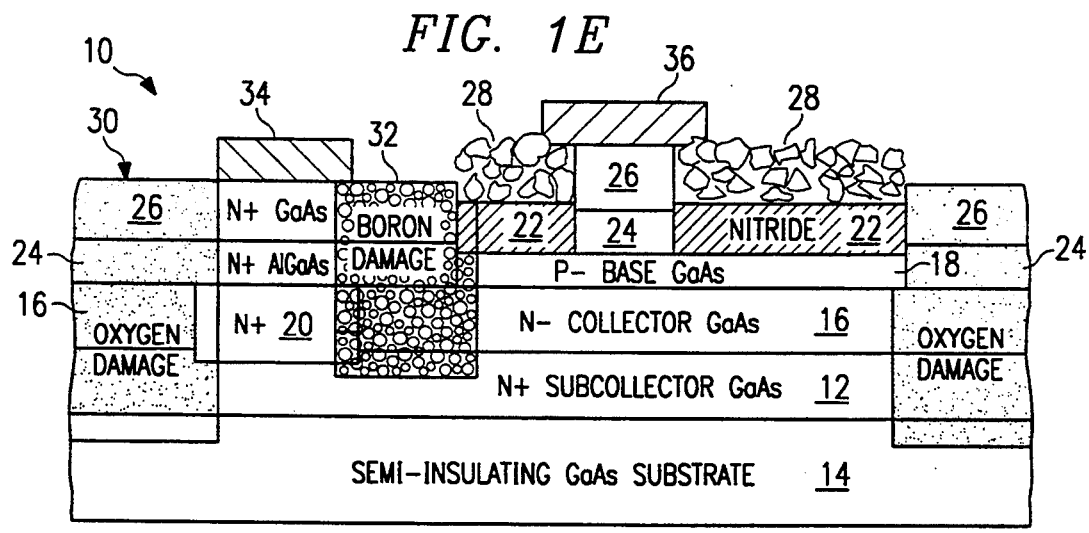

The process continues in FIG. 1E where high energy oxygen implants 30 isolate transistor 10 from adjacent devices by damaging the structure layers. A boron implant layer 32 is implanted between collector implant layer 20 and base layer 18. The damage due to the boron implant layer 32 isolates collector implant layer 20 from base layer 18 and emitter layer 24. Ohmic material having an N− conductivity type is deposited and selectively lifted off to form collector contact 34 and emitter contact 36. Emitter contact 36 can be larger than the previously exposed area of base layer 18 to avoid any misalignment problems during formation. Insulating layer 28 is semi-insulating and will not make good ohmic contact to emitter contact 36. Similarly, good ohmic contact is not made if no insulating layer 28 was deposited onto interface layer 22. The lack of a good ohmic contact to insulating layer 28 reduces leakage paths between emitter contact 36 and a subsequent base contact. Leakage paths can be further reduced by etching insulating layer 28 from beneath emitter contact 36 by using interface layer 22 as an etch stop.

Figure 1F:
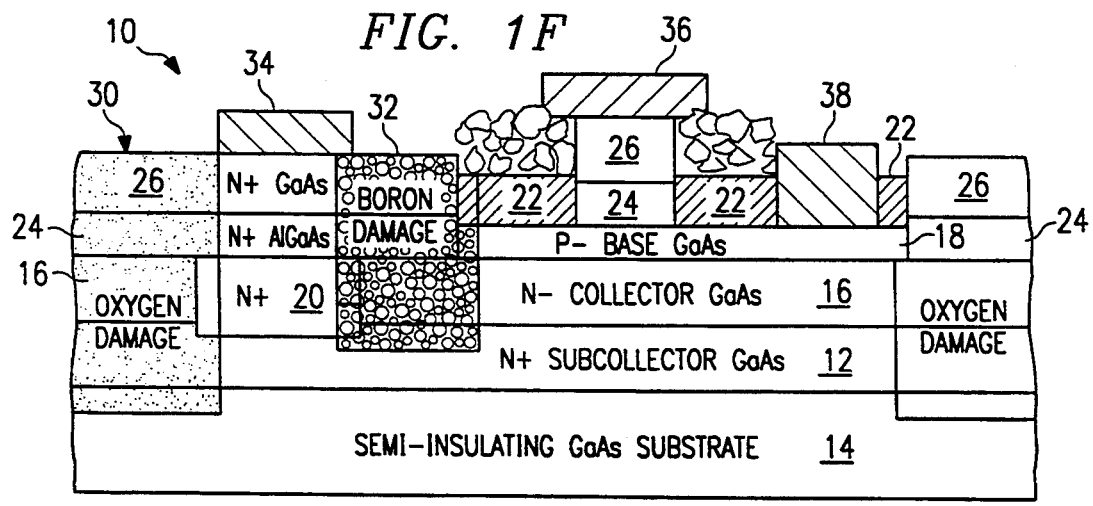

The process continues in FIG. 1F where a portion of insulating layer 28 predefining a base contact is etched down to the interface layer 22 which acts as an etch stop. Interface layer 22 is then etched away to reveal base layer 18. The etch to base layer 22 is not critical as to etch time due to the etch step provided by interface layer 22. An ohmic material with a P− conductivity type is deposited and selectively lifted off to leave a base contact 38. Collector contact 34, emitter contact 36, and base contact 38 are annealed and are now ready to be probed.

Figure 2A:
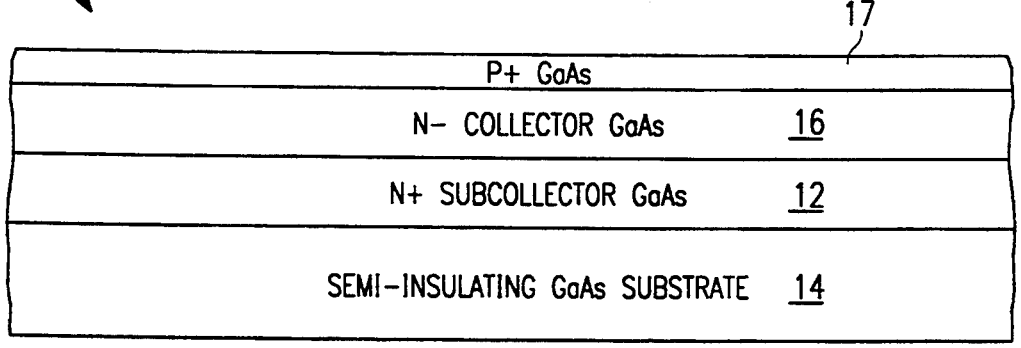
FIGS. 2A–2C illustrate alternative steps in the fabrication of the heterojunction bipolar transistor.
Figure 2B:
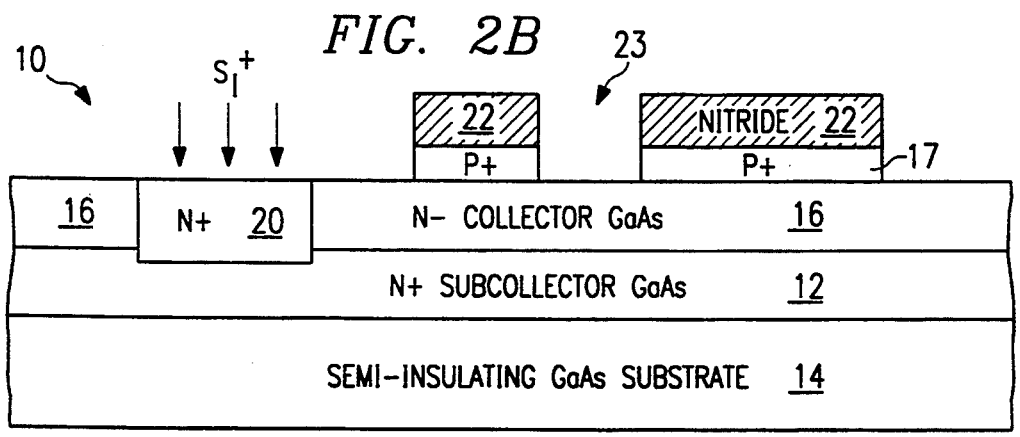
Figure 2C:
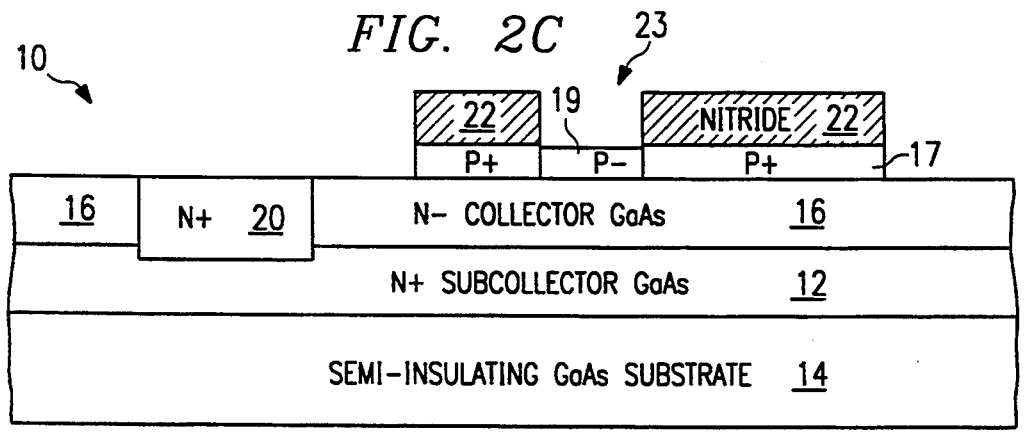

FIGS. 2A–C show alternative steps which may be used in the fabrication of transistor 10. The process begins in FIG. 2A where a subcollector layer 12 is grown on a substrate layer 14. A collector layer 16 is grown on subcollector layer 12 as previously described. An extrinsic base layer 17 is grown on collector layer 16. Extrinsic base layer 17 is doped with a P+ conductivity type.

The process continues in FIG. 2B where interface layer 22 is deposited on extrinsic base layer 17. Interface layer 22 and extrinsic base layer 17 are selectively removed such that a gap exists within interface layer 22 and extrinsic base layer 17, exposing a portion of collector layer 16. Collector implant layer 20 is formed as previously described.

The process continues in FIG. 2C where an intrinsic base layer 19 is grown on transistor 10 and selectively removed such that intrinsic base layer 19 only remains on collector layer 16 within gap 23. Intrinsic base layer 19 forms the intrinsic base of transistor 10 while connecting to previously deposited and etched extrinsic base layer 17. Intrinsic base layer 19 is more lightly doped than extrinsic base layer 17 which results in higher current gains for transistor 10. Low base resistance is maintained by the heavily doped extrinsic base layer 17 grown during the initial epitaxial deposition. Intrinsic base layer 17 is self aligned to the subsequent emitter ohmic contact. From this point, the process continues as previously described with respect to FIG. 1D.

The alternate version described in relation to FIGS. 2A–C requires three different epitaxial growth cycles. To avoid having three epitaxial growth cycles, overgrowth of intrinsic base layer 19 can be combined with emitter layer 24 overgrowth if collector contact 34 is made by etching down to collector implant layer 20 or collector layer 16.

In summary, a heterojunction bipolar transistor can be fabricated to overcome misalignment problems in forming the emitter contact. The emitter contact region is predefined prior to forming the emitter contact such that the emitter contact is isolated from the base contact and the base layer. This isolation allows for misalignments to occur without causing a short circuit between the emitter and the base.

Thus, it is apparent that there has been provided, in accordance with the present invention, a method of self aligning an emitter contact in a heterojunction bipolar transistor that satisfies the advantages set forth above. Although the preferred embodiment has been described in detail, it should be understood that various changes, substitutions, and alterations can be made herein. For example, process steps and process materials may be altered while maintaining the self aligned nature of the emitter contact. Other examples are readily ascertainable by one skilled in the art and could be made without departing from the spirit and scope of the present invention as defined by the following claims.

What is claimed is:

1. A method of self-aligning an emitter contact, comprising the steps of:
   forming a base layer having a first conductivity type on a portion of a collector layer;
   forming an interface layer on the base layer such that a selected portion of the base layer remains exposed;
   forming an emitter layer having a second conductivity type at the selected portion of the base layer;
   forming an emitter cap layer having the second conductivity type on the emitter layer at the selected portion of the base layer;
   forming an insulating layer on the interface layer;
   forming an emitter contact on the emitter cap layer, wherein the emitter contact overlaps the emitter cap layer and portions of the insulating layer; and
   forming a base contact through the insulating layer and the interface layer for connection to the base layer.

2. The method of claim 1, further comprising the step of:
   removing the insulating layer from the interface layer beneath the emitter contact and the base contact.

3. The method of claim 1, further comprising the steps of:
   removing the selected portion of the base layer;
   forming an intrinsic base layer having the first conductivity type at the selected portion of the base layer, the intrinsic base layer having a lower dopant concentration than the base layer.

4. The method of claim 1, wherein the emitter cap layer has a higher dopant concentration than the emitter layer.

5. The method of claim 1, wherein the base layer, the emitter layer, and the emitter cap layer are made of materials that include Group III and Group V elements of the periodic table.

6. The method of claim 6, wherein the materials include gallium and arsenic.

7. The method of claim 1, wherein the interface layer is made of nitride.

8. A method of self-aligning an emitter contact in a heterojunction bipolar transistor, comprising the steps of:
 growing a base layer having a first conductivity type onto a collector layer having a second conductivity type:
 etching away the base layer such that the base layer covers a portion of the collector layer;
 depositing an interface layer onto the base layer;
 etching away a portion of the interface layer such that a selected portion of the base layer is exposed;
 growing an emitter layer having the second conductivity type onto the selected portion of the base layer;
 growing an emitter cap layer having the second conductivity type onto the emitter layer at the selected portion of the base layer;
 forming an insulating layer onto the interface layer as a result of said emitter layer and emitter cap layer growing steps;
 depositing an emitter contact onto the emitter cap layer at the selected portion of the base layer;
 removing the insulating layer at a selected point;
 removing the interface layer at the selected point;
 depositing a base contact at the selected point such that the insulating layer separates the emitter contact from the base contact.

9. The method of claim 8, further comprising the step of:
 etching away the insulating layer from beneath the emitter contact and the base contact using the interface layer as an etch stop.

10. The method of claim 8, further comprising the steps of:
 etching away the base layer from the selected portion of the base layer to expose the collector layer;
 growing an intrinsic base layer onto the collector layer at the selected portion of the base layer, the intrinsic base layer having a lower dopant concentration than the base layer in order to increase a current gain of the transistor.

11. The method of claim 8, further comprising the step of:
 implanting a collector plug region at a specific point of the collector layer apart from the base layer.

12. A method of fabricating a heterojunction bipolar transistor, comprising the steps of:
 forming a subcollector layer having a first conductivity type on a substrate layer;
 forming a collector layer having the first conductivity type on the subcollector layer;
 forming a base layer having a second conductivity type on a portion of the collector layer;
 forming a collector implant layer having the first conductivity type through the collector layer to the subcollector layer;
 forming an interface layer on the base layer such that a selected portion of the base layer remains exposed;
 forming an emitter layer on the exposed portion of the base layer and on the collector layer;
 forming an emitter cap layer on the emitter layer;
 forming an insulating layer on the interface layer;
 forming a first isolation region separating the collector implant layer from the base layer;
 forming a second isolation layer separating the transistor from an adjacent device;
 forming a collector contact over the collector implant layer;
 forming an emitter contact on the emitter cap layer over the previously exposed portion of the base layer;
 removing a portion of the insulating layer and the interface layer to the base layer;
 forming a base contact at the base layer, the insulating layer separating the emitter contact from the base contact.

13. The method of claim 12, wherein the first isolation region is formed by damaging an area between the collector implant layer and the base layer with a boron implant.

14. The method of claim 12, wherein the second isolation region is formed by damaging an area between the transistor and the adjacent device with a high energy oxygen implant.

15. The method of claim 12, further comprising the steps of:
 removing the base layer at the selected portion of the base layer;
 forming an intrinsic base layer within the selected portion of the base layer.

* * * * *